United States Patent
Sato et al.

(10) Patent No.: US 8,174,130 B2
(45) Date of Patent: May 8, 2012

(54) LASER DICING SHEET AND MANUFACTURING METHOD FOR CHIP BODY

(75) Inventors: Yosuke Sato, Tokyo (JP); Yoji Wakayama, Tokyo (JP); Naoki Taya, Tokyo (JP)

(73) Assignee: Lintec Corporation, Tokyo (JP)

( * ) Notice: Subject to any disclaimer, the term of this patent is extended or adjusted under 35 U.S.C. 154(b) by 419 days.

(21) Appl. No.: 11/949,163

(22) Filed: Dec. 3, 2007

(65) Prior Publication Data

US 2008/0132034 A1    Jun. 5, 2008

(30) Foreign Application Priority Data

Dec. 5, 2006 (JP) .................. 2006-328612

(51) Int. Cl.
  *H01L 23/48* (2006.01)
  *H01L 23/52* (2006.01)
  *H01L 29/40* (2006.01)
  *B23K 26/00* (2006.01)
(52) U.S. Cl. .................. 257/782; 219/121.85
(58) Field of Classification Search .................. 257/782, 257/798; 219/121.85
  See application file for complete search history.

(56) References Cited

U.S. PATENT DOCUMENTS

| | | | |
|---|---|---|---|
| 3,558,564 A * | 1/1971 | Vasta .............................. | 528/58 |
| 4,555,535 A * | 11/1985 | Bednarek et al. ............... | 524/40 |
| 6,139,953 A | 10/2000 | Nagamoto et al. | |
| 6,156,423 A | 12/2000 | Nagamoto et al. | |
| 7,351,645 B2 | 4/2008 | Ohashi et al. | |
| 7,402,503 B2 | 7/2008 | Hara | |
| 2002/0091173 A1* | 7/2002 | Hashimoto et al. ............ | 522/150 |
| 2005/0186709 A1* | 8/2005 | Okawa .......................... | 438/113 |
| 2005/0208296 A1* | 9/2005 | Saiki et al. .................... | 428/343 |
| 2005/0269717 A1* | 12/2005 | Ohashi et al. ................. | 257/783 |
| 2005/0288457 A1* | 12/2005 | Liu et al. ....................... | 525/529 |
| 2006/0157191 A1 | 7/2006 | Matsuo et al. | |
| 2008/0190904 A1* | 8/2008 | Wakayama et al. ...... | 219/121.72 |
| 2008/0220253 A1* | 9/2008 | Ohashi et al. ........... | 428/355 EN |
| 2009/0261084 A1* | 10/2009 | Wakayama et al. ...... | 219/121.85 |

FOREIGN PATENT DOCUMENTS

| | | |
|---|---|---|
| JP | 60-196956 | 10/1985 |
| JP | 60-223139 | 11/1985 |
| JP | 05-077284 | 3/1993 |
| JP | 06-101455 | 4/1994 |
| JP | 2001-207140 | 7/2001 |
| JP | 2002-141306 | 5/2002 |
| JP | 2002-343747 | 11/2002 |
| JP | 2006-093368 | 4/2006 |
| JP | 2006-192474 | 7/2006 |
| JP | 2006-245487 | 9/2006 |

OTHER PUBLICATIONS

CRC Handbook of Chemistry and Physics, 82 nd edition, David R. Lide editor in chief, Washington, DC 2001-2002, pp. 13-1 to 13-4.*
Stefan Oprea, "Synthesis and Characterization of Polyurethane Urea Acrylates: Effects of the Hard Segments Structure", May 11, 2007, Journal of Applied Polymer Science, vol. 105, 2509-2515.*

(Continued)

*Primary Examiner* — William D Coleman
(74) *Attorney, Agent, or Firm* — Hahn & Voight PLLC; Roger C. Hahn

(57) ABSTRACT

Disclosed herein is a laser dicing sheet comprising a base material comprising a polyurethane acrylate film and a shape-restoring film; and an adhesive layer formed on a surface of said polyurethane acrylate film of the base material.

20 Claims, 1 Drawing Sheet

OTHER PUBLICATIONS

Yaobin et al., "Synthesis of Polyurethane Acrylate and Application to Ultraviolet-Curable Pressure-Sensitive Adhesive", Dec. 1, 2006, Polymer-Plastices Technology and Engineering, vol. 45, pp. 495-502.*

S. Oprea et al., Synthesis and characterization of poly(urethane-urea-acrylates)s, European Polymer Journal, vol. 35, 1999, Elsevier Science Ltd., pp. 1269-1277.*

U.S. Appl. No. 11/949,350, filed Aug. 14, 2008, Wakayama et al.

* cited by examiner

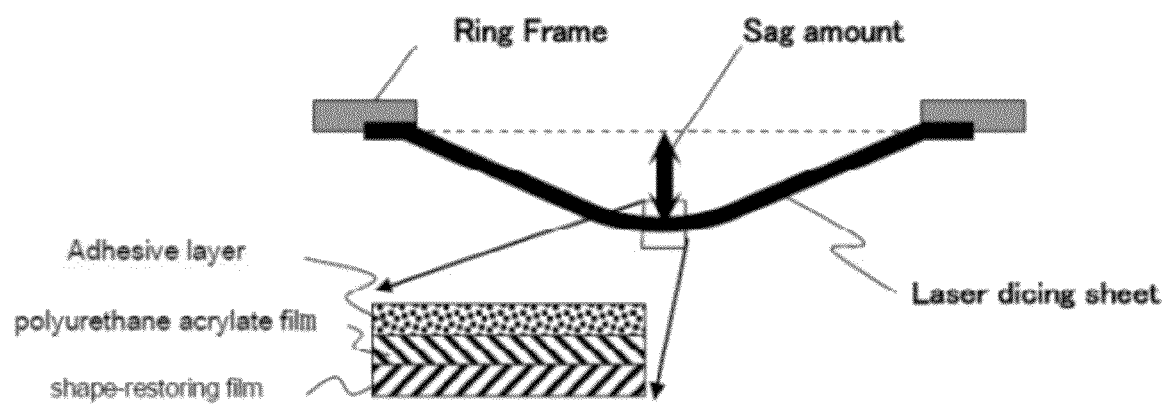

LASER DICING SHEET AND MANUFACTURING METHOD FOR CHIP BODY

BACKGROUND OF THE INVENTION

1. Field of the Invention

The present invention relates to a laser dicing sheet suitably used for fixing a work so as to make into chips by dicing with laser beam and a manufacturing method for chip body with suitably using the laser dicing sheet.

2. Description of the Related Art

In recent years, since there is a case that a work is difficult to cut by a blade dicing, a laser dicing is particularly attracted which is capable of cutting the work by the laser dicing. As shown in Japanese Patent Application Laying Open No. 2002-343747, an example of a laser dicing sheet used for the laser dicing is disclosed by the applicant.

In the laser dicing, a work fixed on a dicing sheet is cut by scanning the laser beam. In this case, a focal point of the laser beam moves as following, namely, the focal point is accelerated from a surface of the dicing sheet wherein the work is not attached (an outer edge portion of the work), scanning on a surface of the work at constant speed, the focal point is decelerated at the opposite outer edge portion of the work, then the focal point stops. After that, a movement direction is turned and the focal point of the laser beam is accelerated, scanning on the work surface, the laser beam is again decelerated and stops and turned.

Therefore, at the time of accelerating and decelerating speeds when moving the laser beam focal point, the laser beam is directly irradiated on end portions of the dicing sheet wherein the work is not attached. There is a problem that, at this time, the laser beam transmits through the dicing sheet and a chuck table is damaged. Further, there is a problem that a surface of the dicing sheet, which contacts with the chuck table heated by the laser beam, is melting and is fused with the chuck table.

In order to eliminate these problems, a distance between the work and a surface of the chuck table is lengthened by using a dicing sheet having large thickness which is shown in Japanese Patent Application Laying Open No. 2006-245487. By using this method, the laser beam reached to the chuck table is not focused, therefore, the chuck table is not damaged since an energetic density is low. Further the above mentioned welding problem is not occurred. However, there are sometimes difficult to expand after the dicing because the thickness of a base material is thick.

Also, Japanese Patent Application Laying Open No. 2002-141306 discloses a dicing sheet comprising an adhesive layer on a base material (herein after sometimes called as "polyurethane acrylate film") obtained from film forming and curing curable resin such as urethane acrylate oligomer and the like. However, in this patent literature, it is intended to apply the blade dicing and specific problems of the laser dicing as mentioned above are not recognized.

It is expected that film damage is relatively minor even though the laser beams is directly irradiated, because a crosslink density of the polyurethane acrylate film is high. Also, because an expanding ability is favorable, it is easy to expand the laser dicing sheet after the dicing to thereby spread the space between chips. Therefore, it should be studied to use polyurethane acrylate film as a base material stated above.

However, in case of using polyurethane acrylate film as a base material of the dicing sheet, there is following concern. Normally, after expanding process and picking up chips, the dicing sheet adhered on a ring frame is stowed in a recovery cassette and recovered. After recovering, removing dicing sheet from the ring frame, the ring frame is reused via cleaning process and the like. Since the dicing sheet is elongated by expanding, the dicing sheet is sagging from the ring frame. In this status, the sagging dicing sheet cannot be recovered to the recovery cassette smoothly, because the dicing sheet contacts other recovered ring frame and sheet.

For example, although polyurethane acrylate film excelled in expanding ability, it is less shape-restoring.

Therefore, although polyurethane acrylate film is expected to have excellent character as a base material of the laser dicing sheet, there is an impediment in practical use because of poor shape-restoring capability.

DISCLOSURE OF THE INVENTION

Problems to be Solved by the Invention

The present invention attempts to solve the problems associated with the above mentioned conventional art. Namely, an object of the present invention is to provide a laser dicing sheet which is capable of preventing cutting of dicing sheet by laser beam, damage of the chuck table and fusion of the dicing sheet to the chuck table. Another object of the present invention is to provide a manufacturing method for chip body by using laser dicing method wherein the laser dicing sheet is used. Particularly, the present invention aims to improve shape-restoring ability after expanding of the base material using polyurethane acrylate film which is expected to have excellent properties in the laser dicing.

Means for Solving the Problem

Gist of the present invention aims for solving these problems is as follows;

(1) A laser dicing sheet comprising:
a base material comprising a polyurethane acrylate film and a shape-restoring film; and
an adhesive layer formed on a surface of said polyurethane acrylate film of the base material.

(2) The laser dicing sheet as set forth in (1), wherein the polyurethane acrylate film which constitutes the base material is a cured product obtained by irradiating energy beam to a mixture including an energy beam curable urethane acrylate oligomer and an energy beam curable monomer.

(3) The laser dicing sheet as set forth in (2), wherein the energy beam curable urethane acrylate oligomer is a polyether type urethane acrylate oligomer.

(4) The laser dicing sheet as set forth in (3), wherein an ether bonding portion of the polyether type urethane acrylate oligomer is an alkylene oxy group (—(—R—O—)n-: wherein R is alkylene group, n is an integer of 2 to 200).

(5) The laser dicing sheet as set forth in (4), wherein the alkylene group R of the alkylene oxy group (—(—R—O—)n-) is alkylene group having 1 to 6 carbon atoms.

(6) The laser dicing sheet as set forth in (5), wherein the alkylene group R of the alkylene oxy group (—(—R—O—)n-) is ethylene, propylene, butylene or tetramethylene.

(7) The laser dicing sheet as set forth in any one of (1) to (6), wherein a deformation restoring ratio after removing a stress of the shape-restoring film is 80% to 100%.

(8) The laser dicing sheet as set forth in (7), wherein the shape-restoring film is a polyolefin film.

(9) The laser dicing sheet as set forth in (8), wherein the polyolefin film is low-density polyethylene film, linear low-density polyethylene film, flexible polypropylene film, ethylene-(meth)acrylic acid copolymer film, ethylene-(meth) acrylic ester copolymer film or ethylene-vinyl acetate copolymer film.

(10) Method for manufacturing a chip body comprising steps of;

adhering a work on the adhesive layer of the laser dicing sheet as set forth in any one of (1) to (9);

dicing the work into individual chips by laser beam;

expanding the laser dicing sheet to thereby spread the space between the chips; and picking up the chips.

Effects of Invention

In the present invention, because of using polyurethane acrylate film as the most upper layer of a base material, a received damages is small and not be cut fully, even though laser beam is irradiated to the base material. Also, the base material is not damaged and an amount of light transmitted through the base material and reached to the chuck table is decreased. As a result, in the laser dicing, cutting of a laser dicing sheet, damage of the chuck table and fusion of the dicing sheet to the chuck table are prevented which cause manufacturing processes for the chip body by laser dicing can be operated smoothly. Also, recovering the ring frame can smoothly be operated, because using the shape-restoring film in addition to polyurethane acrylate film as a structural layer, of the base material, to thereby improving shape-restoring ability after expanding the sheet.

BRIEF DESCRIPTION OF THE DRAWING

FIG. 1 is a drawing explaining the "sag" amount evaluated in examples.

BEST MODE FOR CARRYING THE INVENTION

Hereinafter, the present invention will be explained specifically. A dicing sheet of the present invention is composed of a base material, and an adhesive layer formed thereon.

The base material is composed of a polyurethane acrylate film and a shape-restoring film.

Polyurethane acrylate film as one of a structural layer of the base material is a resin film whose main constituent is polyurethane acrylate. As the polyurethane acrylate film, it is preferable a cured product obtained by irradiating energy beam to a mixture including an energy beam curable urethane acrylate oligomer and an energy beam curable monomer after film forming.

An energy beam curable urethane acrylate oligomer is obtained by e.g., reacting (meth)acrylate having hydroxyl group with terminal isocyanate urethane prepolymer obtained by reacting polyol compound such as a polyester type or polyether type with polyvalent isocyanate compound.

Although the polyol compounds may be any of alkylene diol, polyether type polyol, polyester type polyol or polycarbonate type polyol, more preferable effects is obtained by using polyether type polyol. Also, if it is the polyol, it is not particularly limited and it may be difunctional diol, trifunctional triol, however, in view of availability, general versatility, reactivity and the like, using diol is particularly preferable. Therefore, polyether type diol is preferably used.

The polyether type diol is generally shown as HO—(—R—O—)n-H. Here, R is bivalent hydrocarbon group, preferably, alkylene group, further preferably alkylene group having 1 to 6 carbon atoms, particularly preferably alkylene group having 2 or 3 carbon atoms. Also, in the alkylene group having 1 to 6 carbon atoms, preferred is ethylene, propylene, butylene or tetramethylene, particularly preferably ethylene or propylene. Also, n is preferably 2 to 200, particularly preferably 10 to 100. Therefore, as the polyether type diol which is particularly preferable, polyethylene glycol, polypropylene glycol, polybutylene glycol, polytetramethylene glycol are exemplified and as the particularly preferable polyether type diol, polyethylene glycol, polypropylene glycol are exemplified.

The polyether type diol produces the terminal isocyanate urethane prepolymer by reacting with polyvalent isocyanate compound to introduce ether bonding portion (—(—R—O—)n-). Such the ether bonding portion may be a constitution to be induced by ring-opening reaction of cyclic ether such as ethylene oxide, propylene oxide, tetrahydrofuran and the like.

As the polyvalent isocyanate compound, for example, 4,4'-dicyclohexyl methane diisocyanate, isophorone diisocyanate, 2,4-tolylene diisocyanate, 2,6-tolylene diisocyanate, 1,3-xylylene diisocyanate, 1,4-xylylene diisocyanate, diphenylmethane-4,4'-diisocyanate are used and particularly preferably, 4,4'-dicyclohexyl methane diisocyanate, isophorone diisocyanate are used.

Then, urethane acrylate oligomer can be obtained by reacting terminal isocyanate urethane prepolymer and hydroxyl-containing (meth)acrylate. As the hydroxyl-containing (meth)acrylate, for example, 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, polyethylene glycol acrylate and polyethylene glycol methacrylate are used, particularly, 2-hydroxyethyl acrylate or 2-hydroxyethyl methacrylate are used.

The urethane acrylate oligomer is shown by the general formula: Z—(Y—(X—Y)m)—Z (here X is a constituent unit derived from polyether type diol, Y is a constituent unit derived from diisocyanate, Z is a constituent unit derived from hydroxyl-containing (meth)acrylate). In the above general formula, m is preferably selected as being 1 to 200, further preferably selected as being 1 to 50.

The obtainable urethane acrylate oligomer includes photo polymerizable double-bond in its molecule, and has such properties to cure by energy beam polymerization, to thereby form film.

A weight-average molecular weight of the urethane acrylate oligomer preferably used in the present invention is within a range of 1000-50000, more preferably within a range of 2000-40000. The above urethane acrylate oligomer can be used singly or in combination of two or more. It is often difficult to obtain a film only from the above urethane acrylate oligomer. Thus, films are generally obtained by diluting with an energy beam curable monomer, conducting a film formation, and curing the film. The energy beam curable monomer includes energy beam polymerize double bonding in its molecule, particularly in the present invention, acryl ester compound having relatively bulky group is preferably used.

As a specific example of energy beam curable monomer to be used for diluting such the urethane acrylate oligomer, it is exemplified alicyclic compound such as isobornyl (meth)acrylate, dicyclopentenyl(meth)acrylate, dicyclopentanyl (meth)acrylate, dicyclopentenyloxy (meth)acrylate, cyclohexyl(meth)acrylate, adamantane (meth)acrylate, aromatic compound such as phenyl hydroxypropyl acrylate, benzyl acrylate, phenol ethylene oxide modified acrylate or heterocyclic compound such as tetrahydrofurfuryl (meth)acrylate, morpholine acrylate, N-vinyl pyrolidone or N-vinyl caprolactam. Also, polyfunctional (meth)acrylate may be used, if necessary. Such the energy beam curable monomer can be used singly or in combination of two or more.

The above energy beam curable monomer are used, preferably, in the proportion of 5 to 900 parts by weight, further preferably 10 to 500 parts by weight, particularly preferably 30 to 200 parts by weight to 100 parts by weight of the urethane acrylate oligomer.

The polyurethane acrylate film which constitutes a base material is obtained by film forming and curing a composition including urethane acrylate oligomer and the energy beam curable monomer. In this case, by mixing a photo polymerization initiator to the composition, polymerization curing time by the energy beam and energy irradiance dose can be reduced. The photo polymerization initiator can be a photo-initiator such as benzoin compound, acetophenone compound, acylphosphinoxide compound, titanocene compound, thioxanthone compound, peroxide compound and the like, and photosensitizer such as amine, quinone and the like. Specifically, 1-hydroxycyclohexylphenylketone, 2-hydroxy-2-methyl-1-phenylpropane-1-on, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl, β-chloroanthraquinone and the like are exemplified.

The photo polymerization initiator is preferably added in an amount of 0.05 to 15 parts by weight, further preferably 0.1 to 10 parts by weight, particularly preferably 0.3 to 5 parts by weight to a sum of 100 parts by weight of the urethane acrylate oligomer and energy beam curing monomer.

Also, in the above composition, inorganic filler such as calcium carbonate, silica, mica and metallic filler such as iron, lead and the like may be added to the composition. Further, in addition to the above components, colorants such as pigments and dyes may be added to the base material.

As a film forming method, a flow casting method (casting film forming) is preferably adapted. Specifically, film forming is conducted that after casting liquid composition (before curing resin, solution of resin and the like) on for example, process sheet with thin film shape, then, energy irradiating such as ultra-violet ray, electron beam and the like to the liquid composition by polymerization curing for film forming. According to the method, stress to the resin at time of film forming is small and a forming fish eye is small. Further, uniformity of film thickness is high and thickness accuracy is within a range of 2% in normally.

The above-mentioned polyurethane acrylate film is laminated with following described shape-restoring film to form the base material. An adhesive layer is formed on the polyurethane acrylate film of the base material to form a laser dicing sheet of the present invention.

On a surface of the base material, namely, one a surface of the polyurethane acrylate film wherein the adhesive layer is formed, corona treatment may be applied or primer layer may be provided by ethylene-vinyl acetate copolymer and the like, in order to increase adhesion with the adhesive layer.

In the laser dicing sheet of the present invention, although a thickness of the polyurethane acrylate film is not particularly limited as means for solving the problem of the present invention, in view of workability, preferably 10 to 500 μm, more preferably 30 to 300 μm, particularly preferably 50 to 200 μm. The polyurethane acrylate film may be a single layer or multilayer film of the polyurethane acrylate films of the same sort or another species.

The shape-restoring film is a film includes a certain level of expanding character and includes shape-restoring character to before expanding shape after expanding. Such character can be shown by a formula as follows. Here, a deformation restoring ratio after removing the stress is preferably 90 to 100%, further preferably 95 to 100%.

A deformation restoring ratio after removing the stress $$(\%) = (1_e - 1_x)/(1_e - 1_0) \times 100$$

$1_0$: an initial length
$1_e$: an expanded length
$1_x$: a length after restoring As a shape-restoring film as stated above, specifically, a film composed of low-density polyethylene, linear-low-density polyethylene, high-density polyethylene, flexible polypropylene, stretched polypropylene, non-stretched polypropylene, ethylene-propylene copolymer, ethylene (meth) acrylic acid copolymer, ethylene-(meth) acrylic ester copolymer, ethylene-vinyl acetate copolymer, polyvinyl chloride, polyurethane, polyamide, ionomer, fluororesin and the like can be mentioned. Among them, a film composed of polyolefin film is preferable. Specifically, in particular, the low-density polyethylene, linear-low-density polyethylene, flexible polypropylene, ethylene-(meth) acrylic acid copolymer, ethylene-(meth)acrylic ester copolymer, ethylene-vinyl acetate copolymer and the like are preferable.

In a dicing sheet of the present invention, a thickness of the shape-restoring film is preferably 10 to 500 μm, further preferably 20 to 300 μm, particularly preferably 30 to 200 μm. The shape-restoring film may be a single layer or multilayer film of the shape-restoring films of the same sort or another species.

Lamination of film, namely lamination of the respective polyurethane acrylate films, lamination of the respective shape-restoring films and lamination of the polyurethane acrylate film and the shape-restoring film are conducted by conventionally known method, for example, it can be carried out by lamination via bonding agent, adhesive agent or dry lamination.

Note that, in case of constituting following described adhesive layer by ultra-violet ray curable adhesive agent, it is necessary that the structural layer of the base material (the polyurethane acrylate film and the shape-restoring layer) must be transparent to ultra-violet ray.

The laser dicing sheet of the present invention is composed of the above mentioned base material and the adhesive layer formed on the polyurethane acrylate film of the base material.

The adhesive layer can be formed by various conventionally known adhesive agents. As these kinds of adhesive agents, although it is not limited, for example, adhesive agents such as rubber type, acrylic type, silicone type, polyvinyl ether and like are used. Also, an energy irradiating curable type, a heat forming type and an water swelling type adhesive agents can be used.

As energy beam curable type adhesive agent (ultra-violet ray curing, electron radiation curing), particularly it is preferable to use the ultra-violet ray curing adhesive agent. As specific examples of the energy beam curable adhesive agents are shown in Japanese Patent Application Laying Open Nos. 60-196956 and 60-223139. Also, as examples of the water swelling type adhesive agent, it is preferably used those shown in Japanese Patent Publication Nos. 5-77284, 6-101455 and the like.

A thickness of the adhesive layer is preferably 1 to 100 μm, further preferably 3 to 80 μm, particularly preferably 5 to 50 μm. Note that a release film may be stacked on the adhesive layer for protecting the adhesive layer prior to use thereof.

The release film is not particularly limited, release treated film by release agent such as silicone, fluorine, long-chain alkyl group contained carbamate to a film composed of resin, such as polyethylene terephthalate, polypropylene, polyethylene and the like, foamed films thereof or a paper such as coating paper, glassine paper, laminated paper and the like may be used.

The method for providing the adhesive layer on the base material may be either of transferring adhesive layer having predetermined thickness formed by coating onto a surface of the release film or directly coating the adhesive agent on the surface of the base material to thereby forming the adhesive layer.

Next, a manufacturing method for a chip body using the laser dicing sheet of the present invention will be explained.

In the manufacturing method for a chip body of the present invention, adhering a work to the above adhesive layer of the laser dicing sheet of the present invention, scanning a surface of the work by laser beam and obtaining a chip body by cutting the work. Such the laser dicing method itself has been publicly known. In the laser dicing, a focal point of the laser beam moves as mentioned below, namely, a focal point is accelerated from an exposed surface of the dicing sheet wherein the work is not attached (edge portion of the work), scanning on the work surface at a constant speed, the focal point is decelerated at the opposite outer edge portion of the work, then the focal point stops. After that, a movement direction is turned and the focal point of the laser beam is accelerated, scanning on the work surface, the laser beam is again decelerated and stops and turned. Normally, a laser beam scanning is conducted at one to several times per one dicing line.

At the times of accelerating and decelerating of the laser focal point moving, the laser beam is directly irradiated to the edge portion wherein the work is not adhered. At this time, the laser beam occasionally cuts the dicing sheet. Also, there are occasionally to raise a problem that the laser beam transmits through the dicing sheet, a chuck table is damaged by the laser beam. Further, there is a problem that a surface of the dicing sheet, which contacts with the chuck table heated by the laser beam, is melting and fused with the chuck table.

However, in the present invention, by using the above mentioned polyurethane acrylate film as a structural layer of the base material of the laser dicing sheet, the above problem is solved. Namely, in the case of using the laser dicing sheet of the present invention, it is confirmed that the base material is hard to receive damage by the laser beam, even if the laser beam is irradiated the dicing sheet directly. Specifically, only a portion of a surface of a polyurethane acrylate film, which is the most upper layer of the base material, is cut by the laser beam and the base material is not cut fully. Also, the laser beam having high energy does not reach to the chuck table by penetrating the base material and it is not confirmed the fusing of the laser dicing sheet.

After finishing the laser dicing, expanding the laser dicing sheet and thereby spread the space between the chips. According to spread the space between the chips, a damage by contacting each chips can be reduced. After that, picking up the chips, and obtaining the chip bodies. Note that, in the case of the adhesive layer is composed of the ultra-violet ray curable adhesive agent, the ultra-violet ray irradiating is conducted, in response to the necessity, prior to the picking up. The ultra-violet ray curable adhesive is polymerized and cured by irradiating the ultra-violet ray which causes reducing adhesive force, the picking up the chips can smoothly be operated.

After picking up the chips, the dicing sheet adhered on a ring frame is stowed in a recovery cassette and recovered. After recovering, removing dicing sheet from the ring frame, the ring frame is reused via cleaning process and the like. Since the dicing sheet is elongated by expanding, a low shape-restoring capability dicing sheet is sagging from the ring frame. In this status, the sagging dicing sheet cannot be recovered to the recovery cassette smoothly, because the dicing sheet contacts other recovered ring frame and sheet. For example, although the polyurethane acrylate film excels in the expanding capability, lacks of a shape-restoring ability.

However, in the present invention, as a structural layer of the base material, the above mentioned shape-restoring film is added to the polyurethane acrylate film, sag of the dicing sheet can easily be solved. As a result, recovering the ring frame to the recovery cassette can be smoothly, a productive efficiency of the chip body is progressed.

As a work applicable in the present invention, as far as it can be operated a cut treatment by the laser beam, a material is not limited. For example, various of articles, such as a semiconductor wafer, a glass substrate, a ceramic substrate, an organic material substrate such as FPC and the like or a metallic material such as precision component are exemplified.

A laser is a device generating a light whose wavelength and phase are unified, a solid-laser such as YAG (fundamental wavelength=1064 nm), ruby (fundamental wavelength=694 nm) or a gas laser such as argon ion laser (fundamental wavelength=1930 nm) and their higher harmonics wave are known. In the present invention, these various lasers can be used.

In the present invention, because the polyurethane acrylate film is used as the most upper layer of a base material, receiving damage of the base material is small, even though laser beam is irradiated to the base material. Also, an amount of light transmitted through the base material and reached to the chuck table is decreased. As a result, in the laser dicing, cutting of a laser dicing sheet, damage of the chuck table and fusing of the dicing sheet to the chuck table are prevented which cause manufacturing processes for the chip body by laser dicing can be operated smoothly. Also, recovering the ring frame can smoothly be operated, because of using the shape-restoring film in addition to polyurethane acrylate film as a structural layer of the base material, to thereby improving shape-restoring ability after expanding the sheet.

EXAMPLE

Hereinafter, the present invention will be described with by embodiments. However, the present invention is not limited to the embodiments.

[Deformation Restoring Ratio after Removing the Stress of Shape-Restoring Film]

Deformation restoring ratio after removing the stress of shape-restoring film was conducted under following condition.

A deformation restoring ratio after removing the stress $$(\%) = (1_e - 1_x)/(1_e - 1_0) \times 100$$

$1_0$: an initial length
$1_e$: an expanded length
$1_x$: a length after restoring A film of 140 mm length×15 mm width (a thickness is a thickness to be used in the embodiments) is cut out, fixing the film to a tensile tester so as to a gripping width is 100 mm($1_0$) under an ambience 23° C. and 65% humidity, stretching the film until the gripping width is being 150 mm ($1_e$) at a speed of 200 mm/min and kept 1 minute. After this, removing the film from the tensile tester and left at rest during 5 minutes, then, the length of film ($1_x$) is measured.

In the cases that the base material is only one of the polyurethane acrylate film or the shape-restoring film, and in the case of using other film instead of the shape restoring film, a restoring ratio of such the film is measured.

Note that, in the following example and comparative example, a following composition is used as an adhesive agent.

[Adhesive Composition (1)]

30 weight % toluene solution of copolymer produced from 84 parts by weight of butyl acrylate, 10 parts by weight of methyl methacrylate, 1 parts by weight of acrylic acid and 5 parts by weight of 2-hydroxyethyl acrylate (weight-average molecular weight 700,000) was blended with 3 parts by weight of polyvalent isocyanate compound (CORONATE L (produced by Nippon polyurethane Industry Co., Ltd.)) and thus, adhesive composition (1) was obtained.

[Adhesive Composition (2)]

30 weight % toluene solution of copolymer produced from 90 parts by weight of butyl acrylate and 10 parts by weight of acrylic acid (weight-average molecular weight 600,000) was blended with 1 parts by weight of polyvalent isocyanate compound (CORONATE L (produced by Nippon polyurethane Industry Co., Ltd.)) and thus, adhesive composition (2) was obtained.

Also, laser dicing conditions and evaluation methods for dicing results are shown below;

| [Laser dicing condition (1)] | |
|---|---|
| apparatus: | Nd-YAG Laser |
| chuck table material: | quarts |
| wavelength: | 355 nm (third harmonic wave) |
| output: | 5.5 W |
| cyclic frequency: | 10 kHz |
| pulse duration: | 35 nsec |
| irradiation time: | 2 times/1 line |
| cutting speed: | 200 mm/sec |
| defocus amount: | +50 µm from tape surface (focal point on the surface of wafer) |
| wafer material: | silicon |
| wafer thickness: | 50 µm |
| wafer size: | 6 inch |
| chip cut size: | 5 mm square |
| laser scanning distance at outside of wafer: | 5 mm |
| [Laser dicing condition (2)] | |
| apparatus: | Nd-YAG Laser |
| chuck table material: | quarts |
| wavelength: | 355 nm (third harmonic wave) |
| output: | 8 W |
| cyclic frequency: | 10 kHz |
| pulse duration: | 35 nsec |
| irradiation time: | 8 times/1 line |
| cutting speed: | 150 mm/sec |
| defocus amount: | +100 µm from tape surface (focal point on the surface of wafer) |
| wafer material: | silicon |
| wafer thickness: | 100 µm |
| wafer size: | 6 inch |
| chip cut size: | 5 mm square |
| laser scanning distance at outside of wafer: | 5 mm |

[Cutting Depth Evaluation]

After the laser dicing, cross-sectional observation is made to the cutting line and a cutting depth from the surface of the sheet including the adhesive layer was measured (the observation site is a portion where the wafer is not adhered and the laser is irradiated directly). Cut out material fully is listed as "cut".

[Damage of Chuck Table]

A table surface was visually observed after the laser dicing and confirmed as to whether damage was made. No damage on the table is listed as "No", and damaged is listed as "Yes".

[Fusing to Chuck Table]

At the time of take out a wafer with the laser dicing sheet from the dicing table after the laser dicing with using a transport mechanism equipped with the laser dicing apparatus, no transporting problem is listed as fusing "No", the case that there is difficulty to transport smoothly by fusing the dicing sheet to the table is listed as fusing "Yes".

[Expanding Performance]

A dicing sheet on which a wafer is not adhered was subjected to expanding under an ambience 23° C. and 65% humidity, at pulling down amount 10 mm by using a die bonder CSP-100VX produced by NEC Machinery Corporation. Expanding available is listed as "good", a device was stopped due to a toughness of base material or the laser dicing sheet dropped from the ring frame is listed as "NG".

[Restoring Availability]

A maximum distance (herein after referred as "sag amount") between the laser dicing sheet and a plane defined by a lower surface of the ring frame was measured, after kept during one minute at expanding state, removed from the device, left at rest during 5 minutes (23° C., 65% RH), as shown in FIG. 1. The sag amount is less than 8 mm is listed as "good", exceeding 8 mm is listed as "NG".

Example 1

2-hydroxyethyl acrylate (2HEA), 4,4'-dicyclohexyl methane diisocyanate ($H_{12}MDI$) and polyester polyol shown by a following formula (Polyol:molecular weight 826) are prepared at molar ratio 2HEA:$H_{12}$MDI:Polyol=2:4:3. Initially, $H_{12}$MDI and polyester polyol are reacted, 2HEA is added to the obtained product so as to obtain urethane acrylate oligomer.

[Chemical formula]

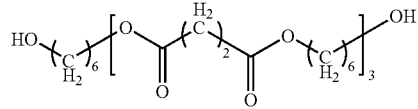

Then, 50 parts by weight of the urethane acrylate oligomer, 50 parts by weight of an energy radiation curable monomer (isobornyl acrylate) and 3 parts by weight of a photoinitiator (IRGACURE184 produced by Ciba Specialty Chemicals) were blended and a film forming coating liquid was obtained.

Resin composition layer was formed by coating the above coating liquid to a silicone release treated polyethylene terephthalate (PET) film (release film; SP-PET3801 produced by Lintec Corporation) by fountain die method as being its thickness is 50 µm. Immediately after coating, laminating the same silicone release treated PET film (release film) on the resin composition layer. Subsequently, the resin composition layer is cured and crosslinked by irradiating energy beam (ultra-violet ray) under a condition 250 mW/cm² of a lighting intensity and 600 m J/cm² of a light illuminance with using a high-pressure mercury lamp and a polyurethane acrylate film having 50 µm thickness is obtained.

The release films laminated on both surface were removed prior to transferring an adhesive layer described following.

Aside from this, the adhesive composition (1) is coated and dried (100° C., 1 minute) on the silicone treated release PET film (SP-PET3801 produced by Lintec Corporation) so as to be a dried adhesive layer thickness 10 µm, and an adhesive layer (1) was formed.

Aside from this, the adhesive composition (2) is coated and dried (100° C., 1 minute) on the silicone treated release PET film (SP-PET3801 produced by Lintec Corporation) so as to be a dried adhesive layer thickness 10 µm, and the adhesive layer is transferred on a linear-low-density polyethylene film (a shape-restoring film) having 60 µm thickness, and a laminated body of an adhesive layer (2) and a linear-low-density polyethylene film was obtained.

Then, the adhesive layer (1) of the PET film is laminated on one surface of the polyurethane acrylate film wherein a release film is peeled. Further, the adhesive layer (2) on the linear-low-density polyethylene film is laminated on the other surface of the polyurethane acrylate film. As the result, a laser dicing sheet having constituting layers of a PET film/an adhesive layer (1)/a polyurethane acrylate film/an adhesive layer (2)/a linear-low-density polyurethane film is obtained.

The laser dicing was conducted under the condition of [Laser dicing condition (1)] with peeling the PET film (SP-PET3801 produced by Lintec Corporation) on the adhesive layer (1) and adhering a silicon wafer having 50 µm thickness. Results are shown in Table 1.

Example 2

2-hydroxyethyl acrylate (2HEA), isophorone diisocyanate (IPDI) and polypropylene glycol (PPG: weight-average molecular weight 2,000) are prepared at molar ratio 2HEA:IPDI:PPG=2:5:4. Initially, IPDI and PPG are reacted, 2HEA is added to the obtained product so as to obtain urethane acrylate oligomer.

Then, 50 parts by weight of the urethane acrylate oligomer, 50 parts by weight of an energy radiation curable monomer (isobornyl acrylate) and 0.5 parts by weight of a photoinitiator (DALOCURE1173 produced by Ciba Specialty Chemicals) were blended and a film forming coating liquid was obtained.

Subsequently, a polyurethane acrylate film was produced by using the obtained coating liquid, according to the same manner as in the example 1.

A laser dicing sheet is obtained from similar operation as in the example 1 except for using the above polyurethane acrylate film, and an ethylene-methacrylic acid copolymer film (methacrylic acid copolymer ratio 9 weight %) having thickness of 60 µm as a shape-restoring film. Results are shown in Table 1.

Example 3

A similar operation as in the above example 2 was conducted except for operating laser dicing under the condition of [Laser dicing condition (2)]. Results are shown in Table 1.

Comparative Example 1

A similar operation as in the above example 1 was conducted except for using ethylene-methacrylic acid copolymer film (methacrylic acid copolymer ratio 9 weight %) having thickness of 100 µm instead of the laminated film of the polyurethane acrylate film and the shape-restoring film. Results are shown in Table 1.

Comparative Example 2

A similar operation as in the above example 1 was conducted except for using PET (polyethylene terephthalate) film having its thickness is 100 µm instead of the laminated film of the polyurethane acrylate film and the shape-restoring film.

Comparative Example 3

A laser dicing sheet was obtained according to a similar operation as in the above example 2 except that the ethylene-methacrylic acid copolymer film (methacrylic acid copolymer ratio 9 weight %) as the shape-restoring film is not laminated and a thickness of the polyurethane acrylate film is changed to 100 µm. Results are shown in Table 1.

Comparative Example 4

A laser dicing sheet was obtained according to a similar operation as in the example 2 except for using the polyurethane acrylate film of the example 1 having thickness of 50 µm instead of the shape-restoring film. Results are shown in Table 1.

Comparative Example 5

A laser dicing sheet was obtained according to a similar operation as in the example 2 except for using the PET film having thickness of 50 µm instead of the shape-restoring film. Results are shown in Table 1.

TABLE 1

| | Deformation restoring ratio after removing the stress of shape-restoring film | Laser dicing condition | Cutting depth (µm) | Damage of chuck table | Fusing to chuck table | Expanding performance | Restoring availability (sag amount) (mm) |
|---|---|---|---|---|---|---|---|
| Example 1 | 90 | (1) | 50 | No | No | good | 6 (good) |
| Example 2 | 95 | (1) | 30 | No | No | good | 5 (good) |
| Example 3 | 95 | (2) | 45 | No | No | good | 5 (good) |
| Comparative Example 1 | 95 | (1) | 15 | Yes | Yes | good | 1 (good) |
| Comparative Example 2 | 26 | (1) | cut | Yes | Yes | NG | — |
| Comparative Example 3 | 66 | (1) | 30 | No | No | good | 12 (NG) |
| Comparative Example 4 | 52 | (1) | 30 | No | No | good | 14 (NG) |
| Comparative Example 5 | 20 | (1) | 30 | No | No | NG | — |

\* In the cases that the base material is only one of the polyurethane acrylate film or the shape-restoring film, and in the case of using other film instead of the shape restoring film, a restoring ratio of such the film is measured.

Laser dicing sheets of the examples 1 to 3 are not cut, damage of the chuck table and fusing to the chuck table were not found. Also, the expanding ability and the restoring ability were excellent. Laser dicing sheets of the comparative examples 1 and 2 do not have a layer composed of the polyurethane acrylate film, hence, damage of the chuck table and fusing to the chuck table were found. A laser dicing sheet of the comparative example 3 does not have a layer composed of the shape-restoring film, hence, a restoring ability was defective. A laser dicing sheet of the comparative example 4 does not have a layer composed of the shape-restoring film of the present invention, hence, a restoring ability was defective. Laser dicing sheets of the comparative examples 2 and 5 do not have the shape-restoring film of the present invention, hence, the laser dicing sheets were dropped from ring frame and cannot be expanded.

The invention claimed is:

1. A laser dicing sheet comprising:
a base material comprising a polyurethane acrylate film and a shape-restoring film; and
an adhesive layer formed on a surface of said polyurethane acrylate film of the base material.

2. The laser dicing sheet as set forth in claim 1, wherein the polyurethane acrylate film which constitutes the base material is a cured product obtained by irradiating energy beam to a mixture including an energy beam curable urethane acrylate oligomer and an energy beam curable monomer.

3. The laser dicing sheet as set forth in claim 1, wherein the polyurethane acrylate film is a cured product obtained by irradiating a mixture including an energy beam curable urethane acrylate oligomer having a photo polymerizable double-bond and an energy beam curable monomer having a polymerizable double-bond, wherein
the energy beam curable urethane acrylate oligomer is obtained by reacting a terminal isocyanate urethane prepolymer and a hydroxyl-containing (meth)acrylate, and the terminal isocyanate urethane prepolymer is obtained by reacting a polyvalent isocyanate compound with a polyol selected from the group consisting of a polyester-type polyol and a polyether-type polyol.

4. The laser dicing sheet as set forth in claim 2, wherein the energy beam curable urethane acrylate oligomer is a polyether type urethane acrylate oligomer.

5. The laser dicing sheet as set forth in claim 4, wherein an ether bonding portion of the polyether type urethane acrylate oligomer is an alkylene oxy group (—(—R—O—)n-: wherein R is alkylene group, n is an integer of 2 to 200).

6. The laser dicing sheet as set forth in claim 5, wherein the alkylene group R of the alkylene oxy group (—(—R—O—)n-) is alkylene group having 1 to 6 carbon atoms.

7. The laser dicing sheet as set forth in claim 6, wherein the alkylene group R of the alkylene oxy group (—(—R—O—)n-) is ethylene, propylene, butylene or tetramethylene.

8. The laser dicing sheet as set forth in any one of claims 1 to 7, wherein a deformation restoring ratio after removing the stress of the shape-restoring film is 80% to 100%.

9. The laser dicing sheet, as set forth in claim 8, wherein the shape-restoring film is a polyolefin film.

10. The laser dicing sheet as set forth in claim 9, wherein the polyolefin film is low-density polyethylene film, linear low-density polyethylene film, flexible polypropylene film, ethylene-(meth)acrylic acid copolymer film, ethylene-(meth) acrylic ester copolymer film or ethylene-vinyl acetate copolymer film.

11. Method for manufacturing a chip body comprising steps of; adhering a work on the adhesive layer of the laser dicing sheet as set forth in any one of claims 1 to 10; dicing the work into individual chips by laser beam; expanding the laser dicing sheet to thereby spread the space between the chips; and picking up the chips.

12. The laser dicing sheet as set forth in claim 3, wherein the hydroxyl-containing (meth)acrylate is selected from the group consisting of 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, polyethylene glycol acrylate and polyethylene glycol methacrylate.

13. The laser dicing sheet as set forth in claim 3, wherein the polyol is a polyether-type diol and the energy beam curable urethane acrylate oligomer has the following formula:

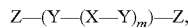

where Y is a constituent unit derived from the polyvalent isocyanate compound, Z is a constituent unit derived from the hydroxyl-containing (meth)acrylate, X is a constituent derived from the polyether-type diol, and m is an integer from 1 to 200.

14. The laser dicing sheet as set forth in claim 3, wherein the polyvalent isocyanate compound is selected from the group consisting of 4,4'-dicyclohexyl methane diisocyanate, isophorone diisocyanate, 2,4-tolylene diisocyanate, 2,6-tolylene diisocyanate, 1,3-xylylene diisocyanate, 1,4-xylylene diisocyanate, and diphenylmethane-4,4'-diisocyanate.

15. The laser dicing sheet as set forth in claim 3, wherein the terminal isocyanate urethane prepolymer is obtained by reacting a polyester-type polyol having the following structure with the polyvalent isocyanate compound:

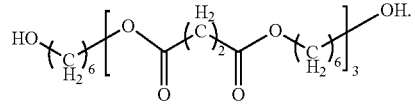

16. The laser dicing sheet as set forth in claim 3, wherein the energy beam curable monomer is present at a proportion of 5 to 900 parts by weight to 100 parts by weight of the energy beam curable urethane acrylate oligomer and the energy beam curable monomer is selected from the group consisting of isobornyl(meth)acrylate; dicyclopentenyl (meth)acrylate; dicyclopentanyl(meth)acrylate; dicyclopentenyloxy(meth)acrylate; cyclohexyl(meth)acrylate; adamantane(meth)acrylate; aromatic compound such as phenyl hydroxypropyl acrylate, benzyl acrylate, phenol ethylene oxide modified acrylate and heterocyclic compound such as tetrahydrofurfuryl(meth)acrylate, morpholine acrylate, N-vinyl pyrolidone or N-vinyl caprolactam; and polyfunctional (meth)acrylates.

17. The laser dicing sheet as set forth in claim 13, wherein an ether bonding portion of the polyether-type diol is an alkylene oxy group (—(—R—O—)n-: wherein R is alkylene group, and n is an integer from 2 to 200.

18. The laser dicing sheet as set forth in claim 15, wherein the polyvalent isocyanate compound is selected from the group consisting of 4,4'-dicyclohexyl methane diisocyanate, isophorone diisocyanate, 2,4-tolylene diisocyanate, 2,6-tolylene diisocyanate, 1,3-xylylene diisocyanate, 1,4-xylylene diisocyanate, and diphenylmethane-4,4'-diisocyanate.

19. A laser dicing sheet comprising:
a base material comprising a cured resin film and a shape-restoring film comprising a polyolefin; and
an adhesive layer formed on a surface of said cured resin film of the base material, wherein the cured resin film is obtained by irradiating a mixture including an energy beam curable urethane acrylate oligomer having a photo polymerizable double-bond and an energy beam curable monomer having a polymerizable double-bond, the energy beam curable monomer present at a proportion of 5 to 900 parts by weight to 100 parts by weight of the energy beam curable urethane acrylate oligomer, and the energy beam curable urethane acrylate oligomer is obtained by reacting a terminal urethane isocyanate prepolymer and a hydroxyl-containing (meth)acrylate, and the terminal isocyanate urethane prepolymer is obtained by reacting a polyether-type diol or a polyester-type diol with a polyvalent isocyanate.

20. The laser dicing sheet as set forth in claim 19, wherein the hydroxyl-containing (meth)acrylate is selected from the group consisting of 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, polyethylene glycol acrylate and polyethylene glycol methacrylate;

the polyvalent isocyanate compound is selected from the group consisting of 4,4'-dicyclohexyl methane diisocyanate, isophorone diisocyanate, 2,4-tolylene diisocyanate, 2,6-tolylene diisocyanate, 1,3-xylylene diisocyanate, 1,4-xylylene diisocyanate, and diphenylmethane-4,4'-diisocyanate;

the energy beam curable monomer is selected from the group consisting of isobornyl (meth)acrylate; dicyclopentenyl(meth)acrylate; dicyclopentanyl(meth)acrylate; dicyclopentenyloxy(meth)acrylate; cyclohexyl (meth)acrylate; adamantane(meth)acrylate; aromatic compound such as phenyl hydroxypropyl acrylate, benzyl acrylate, phenol ethylene oxide modified acrylate and heterocyclic compound such as tetrahydrofurfuryl (meth)acrylate, morpholine acrylate, N-vinyl pyrolidone or N-vinyl caprolactam; and polyfunctional (meth)acrylates;

an ether bonding portion of the polyether-type diol is an alkylene oxy group (—(—R—O—)n-: wherein R is alkylene group, and n is an integer from 2 to 200; and when the energy beam curable urethane acrylate oligomer is obtained by reacting the polyether-type diol, the energy beam curable urethane acrylate oligomer has the following formula:

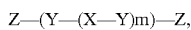

Z—(Y—(X—Y)m)—Z, where Y is a constituent unit derived from the polyvalent isocyanate compound, Z is a constituent unit derived from the hydroxyl-containing (meth)acrylate, X is a constituent derived from the polyether-type diol, and m is an integer from 1 to 200.

* * * * *